(12) United States Patent
Fest

(10) Patent No.: US 9,583,435 B2
(45) Date of Patent: *Feb. 28, 2017

(54) FORMING FENCE CONDUCTORS USING SPACER ETCHED TRENCHES

(71) Applicant: Microchip Technology Incorporated, Chandler, AZ (US)

(72) Inventor: Paul Fest, Chandler, AZ (US)

(73) Assignee: MICROCHIP TECHNOLOGY INCORPORATED, Chandler, AZ (US)

(*) Notice: Subject to any disclaimer, the term of this patent is extended or adjusted under 35 U.S.C. 154(b) by 0 days.

This patent is subject to a terminal disclaimer.

(21) Appl. No.: 14/714,475

(22) Filed: May 18, 2015

(65) Prior Publication Data

US 2015/0249050 A1 Sep. 3, 2015

Related U.S. Application Data

(63) Continuation-in-part of application No. 13/836,647, filed on Mar. 15, 2013, now Pat. No. 9,034,758.

(51) Int. Cl.
*H01L 23/58* (2006.01)
*H01L 21/768* (2006.01)
*H01L 23/528* (2006.01)

(52) U.S. Cl.
CPC ...... *H01L 23/528* (2013.01); *H01L 21/76816* (2013.01); *H01L 2924/0002* (2013.01)

(58) Field of Classification Search
None
See application file for complete search history.

(56) References Cited

U.S. PATENT DOCUMENTS

| 5,618,383 A | * | 4/1997 | Randall | ............... | H01L 21/0271 |
| | | | | | 257/E21.024 |
| 6,837,967 B1 | | 1/2005 | Berman et al. | ............ | 156/345.3 |

(Continued)

FOREIGN PATENT DOCUMENTS

WO    2014/149582 A1    9/2014    ........... G01L 21/768

OTHER PUBLICATIONS

International Search Report and Written Opinion, Application No. PCT/US2014/019735, 14 pages, Jun. 11, 2014.

(Continued)

*Primary Examiner* — Mohammad Islam
*Assistant Examiner* — Jay C Chang
(74) *Attorney, Agent, or Firm* — Slayden Grubert Beard PLLC

(57) ABSTRACT

A spacer etching process produces ultra-narrow conductive lines in a plurality of semiconductor dice. Trenches are formed in a first dielectric then a sacrificial film is deposited onto the first dielectric and the trench surfaces formed therein. Planar sacrificial film is removed from the face of the first dielectric and bottom of the trenches, leaving only sacrificial films on the trench walls. A gap between the sacrificial films on the trench walls is filled in with a second dielectric. A portion of the second dielectric is removed to expose tops of the sacrificial films. The sacrificial films are removed leaving ultra-thin gaps that are filled in with a conductive material. The tops of the conductive material in the gaps are exposed to create "fence conductors." Portions of the fence conductors and surrounding insulating materials are removed at appropriate locations to produce desired conductor patterns comprising isolated fence conductors.

18 Claims, 14 Drawing Sheets

(56) References Cited

U.S. PATENT DOCUMENTS

| | | | |
|---|---|---|---|
| 9,034,758 B2* | 5/2015 | Fest | H01L 23/528 |
| | | | 438/669 |
| 2002/0132470 A1 | 9/2002 | Pallinti et al. | 438/631 |
| 2003/0127426 A1* | 7/2003 | Chang | C23F 1/02 |
| | | | 216/41 |
| 2004/0056246 A1* | 3/2004 | Yan | H01L 51/0545 |
| | | | 257/40 |
| 2006/0154463 A1 | 7/2006 | Furukawa et al. | 438/596 |
| 2008/0293183 A1 | 11/2008 | Tsukamoto et al. | 438/102 |
| 2009/0046493 A1 | 2/2009 | Assefa et al. | 365/87 |
| 2009/0124084 A1 | 5/2009 | Tan et al. | 438/669 |
| 2009/0298247 A1 | 12/2009 | Kim | 438/294 |
| 2010/0120212 A1* | 5/2010 | Yang | H01L 21/0337 |
| | | | 438/239 |
| 2013/0020615 A1 | 1/2013 | Fan et al. | 257/272 |
| 2014/0264614 A1 | 9/2014 | Fest | 257/368 |

OTHER PUBLICATIONS

International Search Report and Written Opinion, Application No. PCT/US2016/031741, 11 pages, Jul. 20, 2016.

* cited by examiner

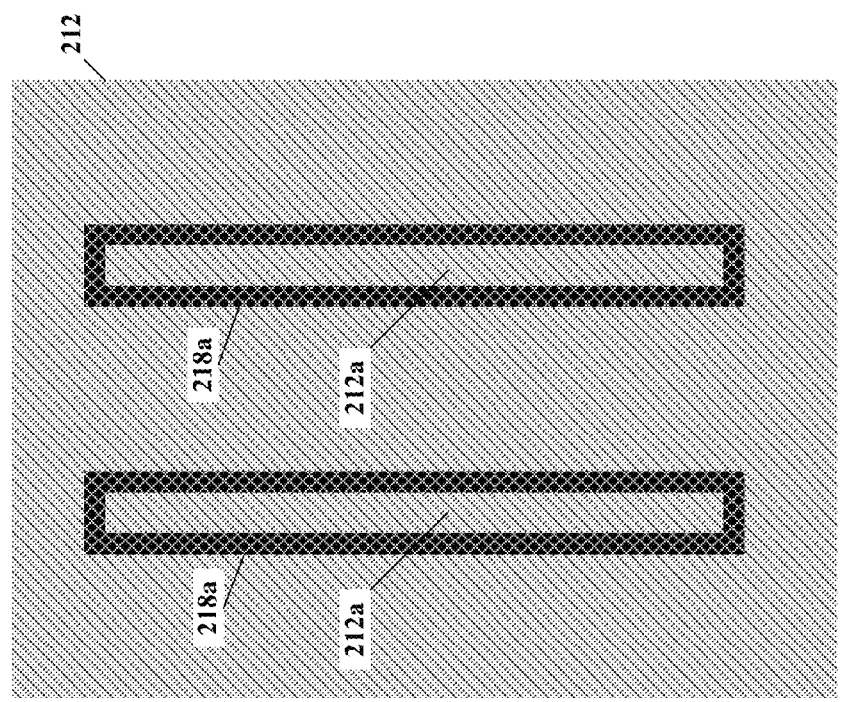

FORMING FENCE CONDUCTORS USING SPACER ETCHED TRENCHES

RELATED PATENT APPLICATIONS

This application is a continuation-in-part of U.S. patent application Ser. No. 13/836,647; filed Mar. 15, 2013, the entire contents of which are hereby incorporated by reference for all purposes.

TECHNICAL FIELD

The present disclosure relates to semiconductor integrated circuit (IC) fabrication, and more particularly, to forming sub-lithographic patterns of conductive lines in the semiconductor die (e.g., integrated circuit die) during fabrication thereof.

BACKGROUND

Reduction in the size of patterned conductive lines used for interconnection of active elements, e.g., transistors, in a semiconductor die has been limited by the lithographic processes available. As the number of transistors have increased on the semiconductor die resulting from improvements in the lithographic masking processes forming these transistors, conductive lines that must interconnect these ever decreasing in size transistors have been unable to decrease proportionally in size with the smaller transistors.

SUMMARY

Therefore, there is need for a way to decrease the size of patterned conductive lines without the limitations of the lithographic processes available for manufacturing semiconductor integrated circuits.

According to an embodiment, a method for forming fence conductors in a semiconductor integrated circuit die may comprise the steps of: depositing a first dielectric on a face of a semiconductor substrate; creating at least one trench in the first dielectric; depositing a sacrificial film on the first dielectric including walls and a bottom of the at least one trench; removing portions of the sacrificial film from a face of the first dielectric and the bottom of the at least one trench, wherein only sacrificial films remain on the walls of the at least one trench; depositing a second dielectric between the sacrificial films on the walls of the at least one trench; removing the first and second dielectrics until top portions of the sacrificial film may be exposed between the first and second dielectrics; removing the sacrificial films between the first and second dielectrics leaving at least two narrow channels therein; depositing conductive material on the faces of the first and second dielectrics and into the at least two narrow channels; and removing portions of the conductive material on the faces of the first and second dielectrics until only tops of the conductive material may be exposed in the at least two narrow channels.

According to a further embodiment of the method, after the step of removing portions of the conductive material on the faces of the first and second dielectrics, may further comprise the step of separating portions of the conductive material in the at least two narrow channels into independent fence conductors. According to a further embodiment of the method, after the step of removing portions of the sacrificial film from the face of the first dielectric and the bottom of the at least one trench, may further comprise the step of removing the sacrificial film from portions of the walls of the at least one trench.

According to a further embodiment of the method, the step of depositing the first dielectric may comprise the step of depositing the first dielectric to a thickness of from about 1 nanometer to about 2000 nanometers, e.g., about 1 nanometer to about 100 nanometers, on the face of the semiconductor substrate. According to a further embodiment of the method, the step of creating the at least one trench comprises the step of creating the at the least one trench to a depth of from about 1 nanometer to about 2000 nanometers, e.g., about 1 nanometer to about 100 nanometers, in the first dielectric. According to a further embodiment of the method, the step of creating the at least one trench comprises the step of creating the at the least one trench having a width of from about 1 nanometer to about 2000 nanometers, e.g., about 1 nanometer to about 100 nanometers, in the first dielectric. According to a further embodiment of the method, the step of depositing the sacrificial film comprises the step of depositing the sacrificial film to a thickness of from about 1 nanometer to about 2000 nanometers, e.g., about 1 nanometer to about 100 nanometers. According to a further embodiment of the method, the step of depositing the second dielectric comprises the step of depositing the second dielectric to a thickness of from about 1 nanometer to about 2000 nanometers, e.g., about 1 nanometer to about 100 nanometers.

According to a further embodiment of the method, the sacrificial film may be selected from the group consisting of SiN, $SiO_2$ and $SiO_xN_y$. According to a further embodiment of the method, the conductive material may be selected from the group consisting of Al, Ag, Au, Fe, Ta, TaN, Ti and TiN. According to a further embodiment of the method, the conductive material comprises copper (Cu).

According to a further embodiment of the method, the step of depositing a barrier layer in the at least one narrow channel may be before the step of depositing the conductive material therein. According to a further embodiment of the method, the step of separating portions of the conductive material may comprise the step of separating portions of the conductive material with reactive-ion etching (RIE). According to a further embodiment of the method, the RIE may be aggressive. According to a further embodiment of the method, may comprise the steps of filling gaps created by the RIE with dielectric, and chemical mechanical planarization (CMP) polishing thereof.

According to another embodiment, a semiconductor die may comprise: a semiconductor substrate; a first dielectric on a face of the semiconductor substrate; at least one trench in the first dielectric; at least two narrow channels in the at least one trench formed with sacrificial films on the walls of the at least one trench and a second dielectric, wherein the second dielectric fills a space between the sacrificial films on the walls of the at least one trench, and whereby the sacrificial films may be removed thereby forming the at least two narrow channels; and a conductive material filling the at least two narrow channels; wherein the conductive material in the at least two narrow channels may be separated and used as fence conductors to connect active elements of said semiconductor die.

According to a further embodiment, a plurality of fence conductors may be made by separating the conductive material in the at least two narrow channels into desired lengths. According to a further embodiment, the first dielectric may have a thickness from about 1 nanometer to about 2000 nanometers, e.g., about 1 nanometer to about 100 nanometers. According to a further embodiment, the at the least one trench may have a depth from about 1 nanometer to about 2000 nanometers, e.g., about 1 nanometer to about 100 nanometers, and a width from about 1 nanometer to about 2000 nanometers, e.g., about 1 nanometer to about 100 nanometers. According to a further embodiment, the sacrificial films have a thickness of from about 1 nanometer to about 2000 nanometers, e.g., about 1 nanometer to about 100 nanometers. According to a further embodiment, the second dielectric may have a thickness from about 1 nanometer to about 2000 nanometers, e.g., about 1 nanometer to about 100 nanometers. According to a further embodiment, a barrier layer may be between the walls of the at least one narrow channel and the conductive material. According to a further embodiment, the conductive material may be copper.

BRIEF DESCRIPTION OF THE DRAWINGS

A more complete understanding of the present disclosure may be acquired by referring to the following description taken in conjunction with the accompanying drawings wherein:

FIG. 4 illustrates a schematic plan view diagram of a plurality of sub-lithographic patterns of conductive lines formed in a semiconductor die, according to a specific example embodiment of this disclosure;

Figure 1:
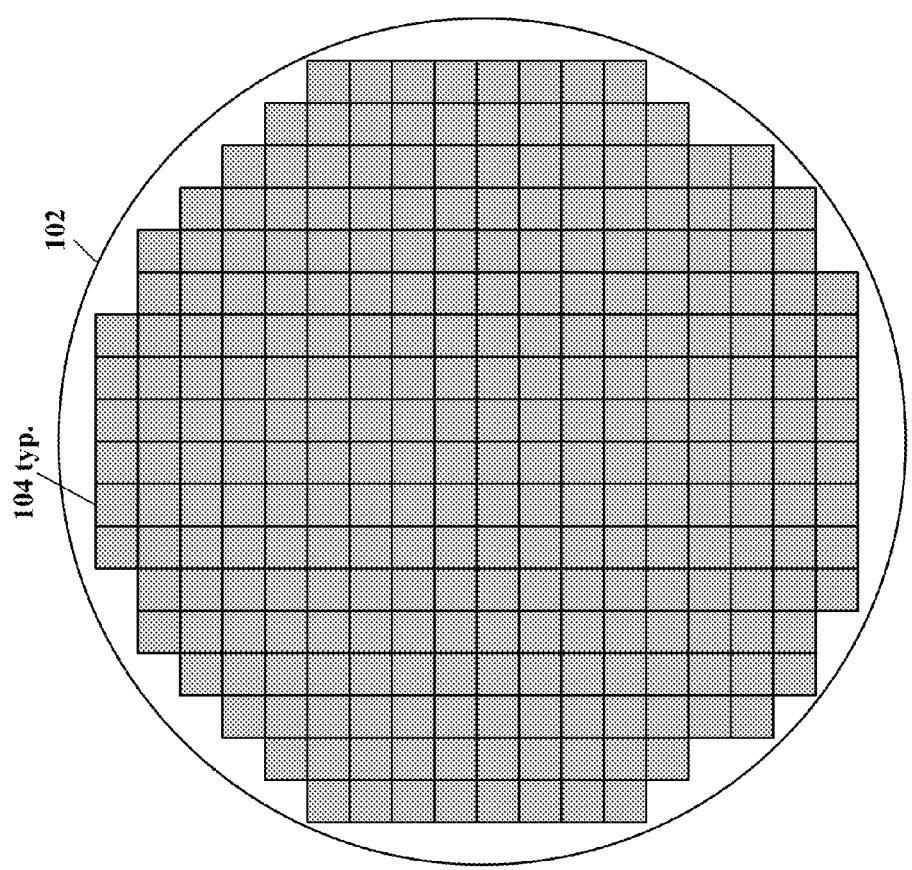
FIG. 1 illustrates a schematic plan view diagram of a semiconductor integrated circuit wafer comprising a plurality of semiconductor dice.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

According to the teachings of this disclosure, a spacer etching process may be used to produce at least one trench in a first dielectric deposited onto a face of a semiconductor die. A sacrificial film is then deposited to a desired thickness onto a face of the first dielectric, including walls and a bottom of the at least one trench. Then the sacrificial film is removed from the face of the first dielectric and the bottom of the at least one trench, leaving only the sacrificial film on the walls of the at least one trench. This may be accomplished by, for example but is not limited to, etching the sacrificial film from the face of the first dielectric and the bottom surface of the at least one trench. Selected portions of the sacrificial film may also be selectively "broken" e.g., removed, during the aforementioned step where the gap fill step may create the break in the conductors. Next a second dielectric is deposited over the face of the first dielectric and the sacrificial film on the walls of the trenches, wherein a gap between the sacrificial films on the walls of the at least one trench is filled in with the second dielectric. Then the second dielectric is removed by, for example but is not limited to, polishing, until the tops of the sacrificial films on the walls of the at least one trench are again exposed.

Next the sacrificial film may be removed by, for example but is not limited to, dip-out, where the dip-out process has good selectivity so as to not remove the dielectric material but effectively removes all of the sacrificial film from the very narrow channels remaining between the first dielectric walls and the second dielectric walls formed from the previous process step. However, a slight etch of the dielectric material may round the top corners of these narrow channels that may improve fill thereof. Next a conductive material fills in these very narrow channels to produce extremely thin fence conductors. Then the face of the dielectric and tops of the extremely thin fence conductors may be planarized with, for example but is not limited to, a chemical mechanical planarization (CMP) process.

This sub-lithographic patterning of conductive lines may be produced in a fabrication process that is compatible with existing aluminum and copper backend processing. Portions of the fence conductors and surrounding insulating materials may be removed at appropriate locations (e.g., "broken") to produce desired conductor patterns comprising the fence conductors. The trench depth helps in determining one dimension of the fence conductors, e.g., conductor height, and the thickness of the deposited sacrificial film determines a second dimension, e.g., conductor width. Lengths of the fence conductors are determined by where the continuous fence conductors are "broken," e.g., separated, disconnections made therebetween, etc., from each other.

Referring now to the drawings, the details of specific example embodiments are schematically illustrated. Like elements in the drawings will be represented by like numbers, and similar elements will be represented by like numbers with a different lower case letter suffix.

Referring to FIG. 1, depicted is a schematic plan view diagram of a semiconductor integrated circuit wafer comprising a plurality of semiconductor dice. A silicon wafer 102 may be scribed into a plurality of semiconductor dice 104 for further processing to create planar transistors, diodes and conductors on each of the plurality of semiconductor dice 104. After all circuits have been fabricated on the plurality of semiconductor dice 104, the dice 104 are singulated (separated) and packaged into integrated circuits (not shown).

Figure 2:
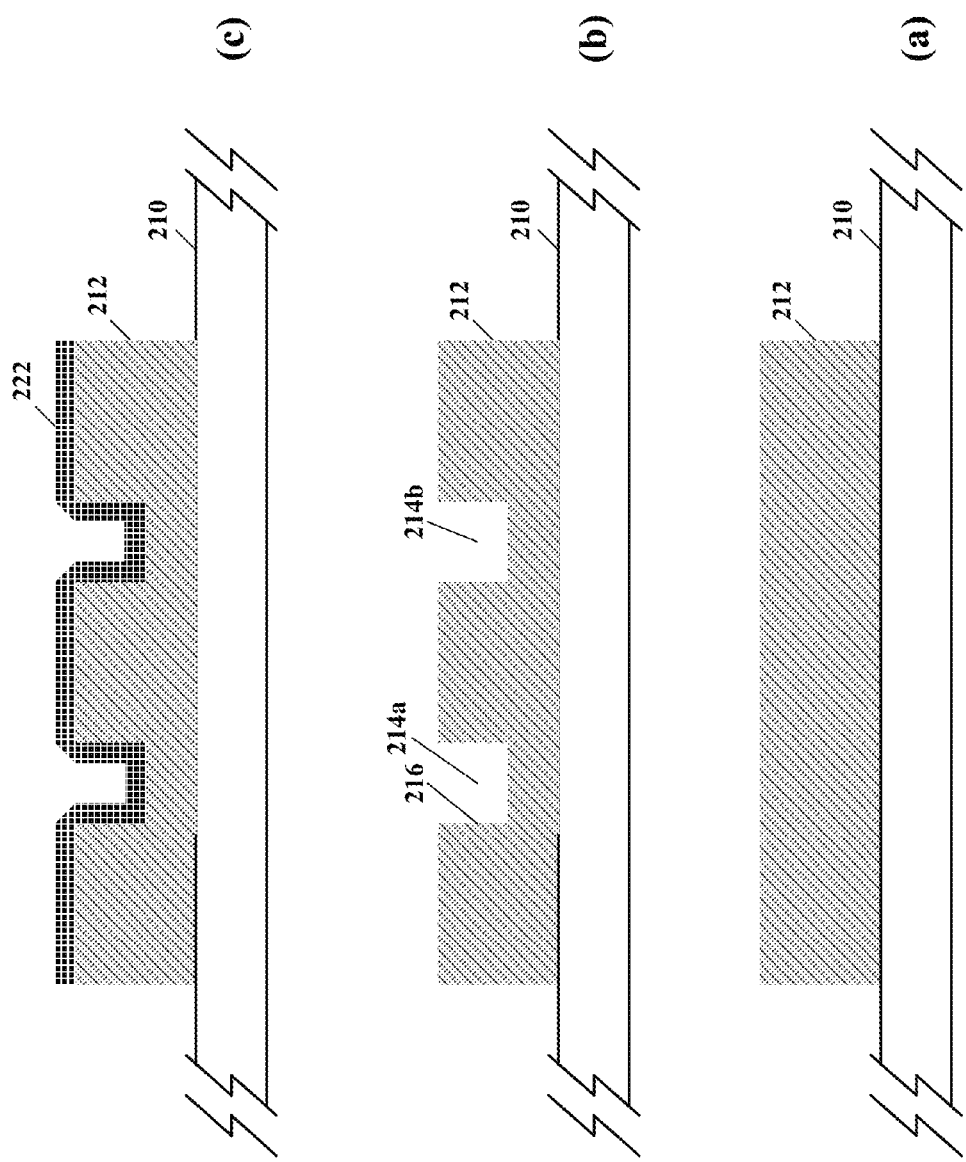
FIGS. 2, 3, 3A and 3B illustrate schematic elevational diagrams of semiconductor fabrication steps for forming sub-lithographic patterns of conductive lines in a semiconductor die, according to specific example embodiments of this disclosure.

Referring to FIGS. 2, 3, 3A and 3B, depicted are schematic elevational diagrams of semiconductor fabrication steps for forming sub-lithographic patterns of conductive lines in a semiconductor die, according to specific example embodiments of this disclosure. The first step (a) in forming fence conductors is shown in FIG. 2 wherein a first dielectric 212 may be deposited on a surface of a semiconductor substrate 210 for each of the plurality of semiconductor dice 104. In the next step (b) the first dielectric 212 may have at least one trench 214 etched therein to a depth that helps determine a dimension, e.g., depth, of the desired fence conductors. The at least one trench 214 comprises walls 216 and a bottom. In step (c) a sacrificial film 222 may be deposited over exposed surfaces of the first dielectric 212 and the at least one trench 214. In step (d) the sacrificial film 222 may be selectively etched from the top surface of the first dielectric 212 and the bottom of the at least one trench 214, leaving only sacrificial films 222a on the walls 216 of the at least one trench 214. Rounding of the tops of the sacrificial films 222a may occur during the etching process.

In step (e) a second dielectric 212a may be deposited over the exposed surfaces of the first dielectric 212 and the sacrificial films 222a on the vertical walls 116 of the at least one trench 214 sufficiently thick enough to fill in the gap between the sacrificial films 222a. In step (f) a portion of the second dielectric 212a may be removed, e.g., polished, sufficiently deep enough to go past and remove the rounded tops of the sacrificial films 222a, otherwise there may be a re-entrant profile that may be very difficult to fill. In step (g) the sacrificial films 222a may be removed from between the first and second dielectrics 212 and 212a by, for example but not limited to, dip-out etching, thereby leaving ultra thin channels, e.g., trenches, furrows or grooves, therein. The dip-out etching may also round off the top corners of these very narrow channels which may improve filling material therein. In step (h) conductive material 218 may be deposited on the first and second dielectrics 212 and 212a to a sufficient thickness to fill in these ultra thin channels. In step (i) the deposited conductive material 218 may be removed from the top faces of the first and second dielectrics 212 and 212a exposing the tops of the ultra thin fence conductors 218a. The depth of the trench 214 may determine the height and the thickness of the deposited sacrificial film 222 may determine the thickness of the fence conductors 218a.

The conductive material 218 may be selected from many different types of conductive materials comprising metals, metal alloys, and non-metallic but conductive compounds that would be suitable for the conductive fences disclosed herein, as would be readily apparent to one having ordinary skill in the art of semiconductor integrated circuit fabrication and also having the benefit of this disclosure.

When copper is used for the conductive material 218b (FIG. 3B) a barrier layer 220 may be used between the copper material 218b and the surfaces of the first and second dielectrics 212 and 212a because copper atoms may diffuse into surrounding materials and thereby degrade their properties. Therefore the barrier layer 220 (FIG. 3B) in step (h1) may be deposited over the exposed surfaces of the first and second dielectrics 212 and 212a before a copper conductive material 218a is deposited in step (h2).

The first dielectric layer 212 may be, for example but is not limited to, SiN, $SiO_2$, $SiO_xN_y$, etc. The second dielectric layer 212a may be, for example but is not limited to, SiN, $SiO_2$, $SiO_xN_y$, etc. The sacrificial film 222 may be, for example but is not limited to, SiN, $SiO_2$, $SiO_xN_y$, etc. The conductive material 218 may be, for example but is not limited to, Al, Ag, Au, Fe, Ta, TaN, Ti, TiN, Cu, etc. The barrier layer 220 may be, for example but is not limited to, Ta, TaN, etc. The various layers or films of the structure may be deposited or otherwise formed using any suitable technique(s) that grow, coat, or otherwise transfers a material onto the wafer or stack, such as, for example, physical vapor deposition (PVD), chemical vapor deposition (CVD), electrochemical deposition (ECD), molecular beam epitaxy (MBE), and atomic layer deposition (ALD), among others.

The thickness of the first dielectric layer 212 may be from about 1 nanometer to about 2000 nanometers. In particular embodiments, e.g., where atomic layer deposition (ALD) is used to form the relevant layers/films of the structure, the thickness of the first dielectric layer 212 may be from about 1 nanometer to about 100 nanometers.

The thickness of the second dielectric layer 212a may be from about 1 nanometer to about 2000 nanometers. In particular embodiments, e.g., where the relevant layers/films of the structure are formed by ALD, the thickness of the second dielectric layer 212a may be from about 1 nanometer to about 100 nanometers.

The thickness of the sacrificial film 222 may be from about 1 nanometer to about 2000 nanometers. In particular embodiments, e.g., where the relevant layers/films of the structure are formed by ALD, the thickness of the sacrificial film 222 may be from about 1 nanometer to about 100 nanometers.

The thickness of the barrier layer 220 may be from about 1 nanometer to about 100 nanometers. In particular embodiments, e.g., where the relevant layers/films of the structure are formed by ALD, the thickness of the barrier layer 220 may be from about 1 nanometer to about 5 nanometers.

The depth of the at least one trench 214 may be from about 1 nanometer to about 2000 nanometers. In particular embodiments, e.g., where the relevant layers/films of the structure are formed by ALD, the depth of the at least one trench 214 may be from about 1 nanometer to about 100 nanometers. The width of the at least one trench 214 may be from about 1 nanometer to about 2000 nanometers. In particular embodiments, e.g., where the relevant layers/films of the structure are formed by ALD, the width of the at least one trench 214 may be from about 1 nanometer to about 100 nanometers. In some embodiments, at least one trench 214 has a depth of about 1 nanometer to about 100 nanometers and a width of about 1 nanometer to about 100 nanometers.

The width or thickness of the fence conductors 218a may be from about 1 nanometer to about 1000 nanometers. In particular embodiments, e.g., where the relevant layers/films of the structure are formed by ALD, the width or thickness of the fence conductors 218a may be from about 1 nanometer to about 10 nanometers.

Figure 3:
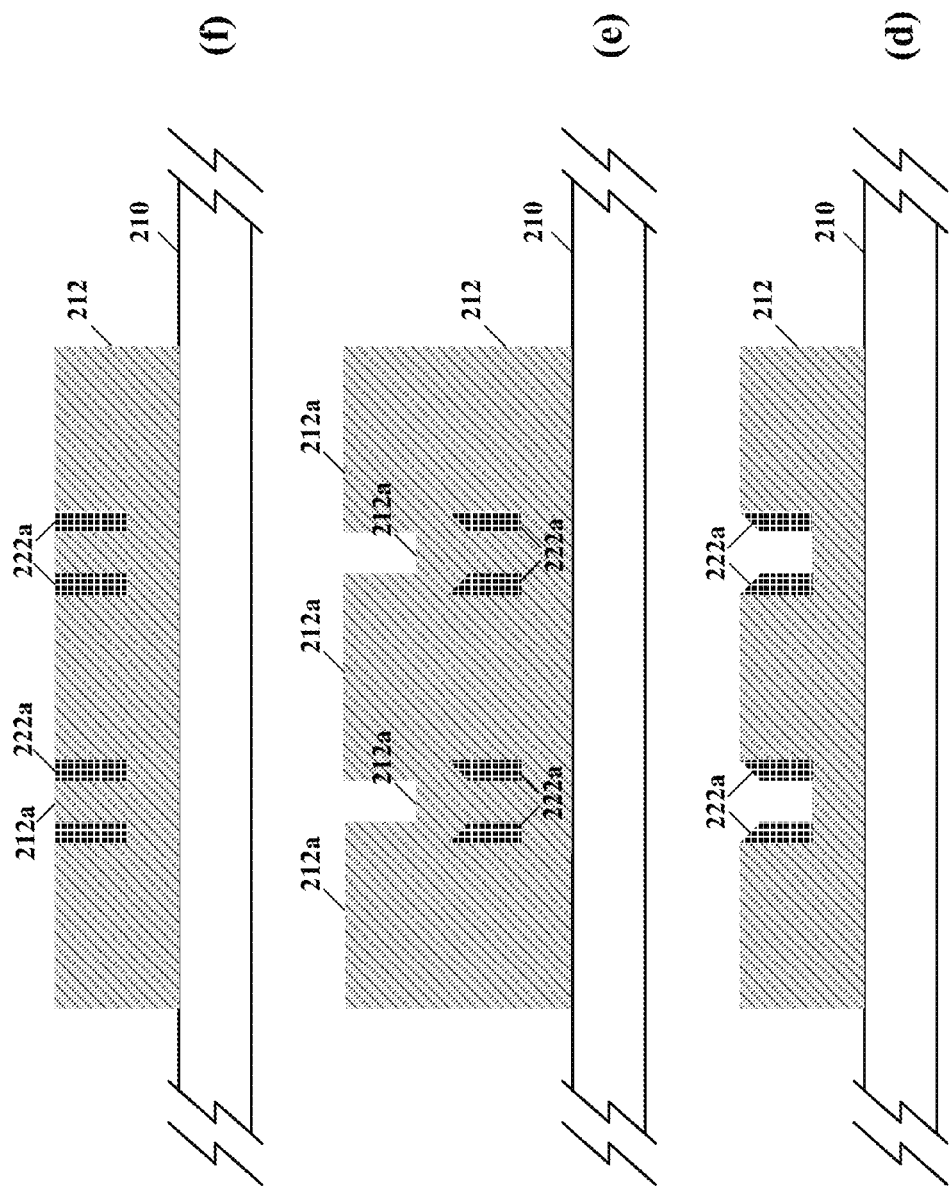
Figure 3A:
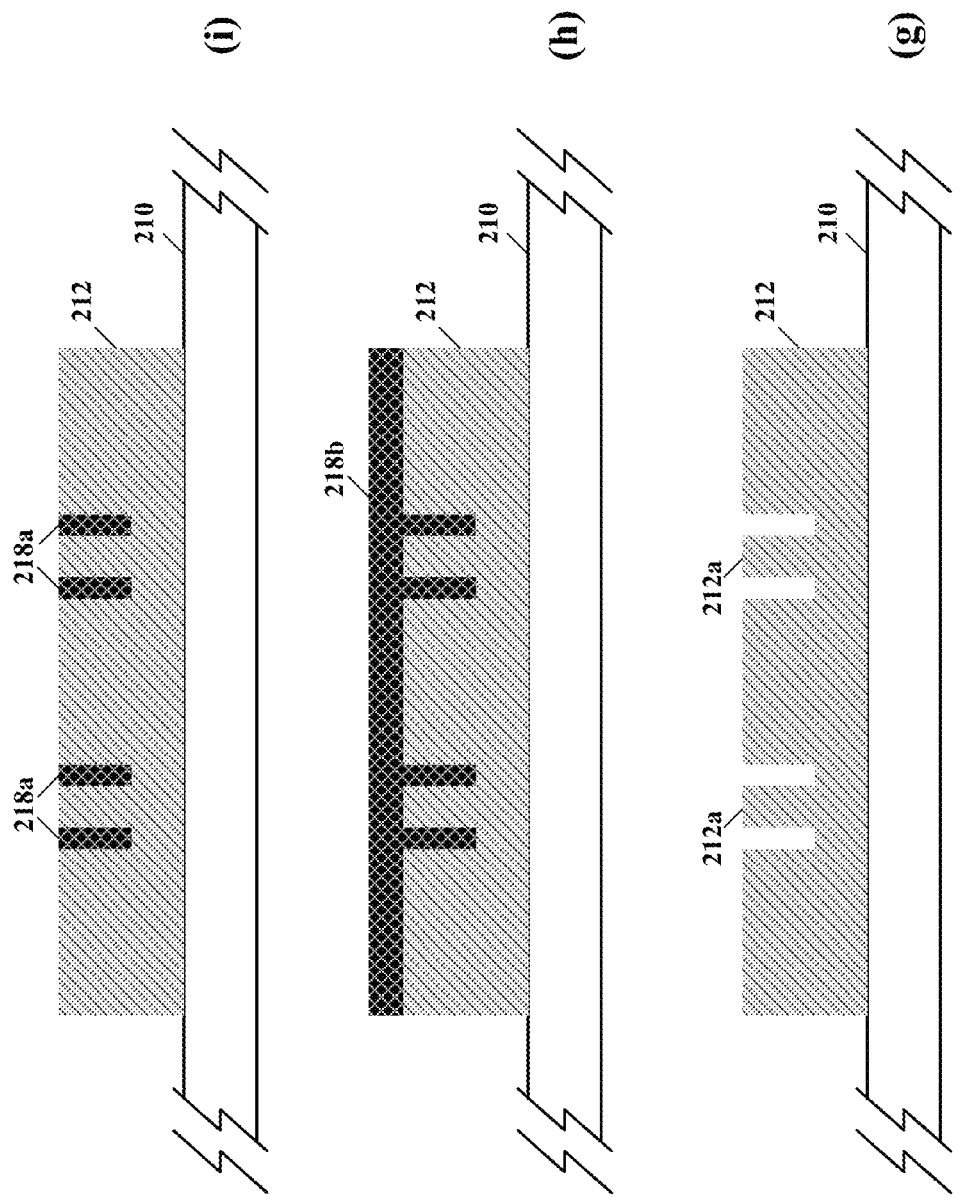
Figure 3B:
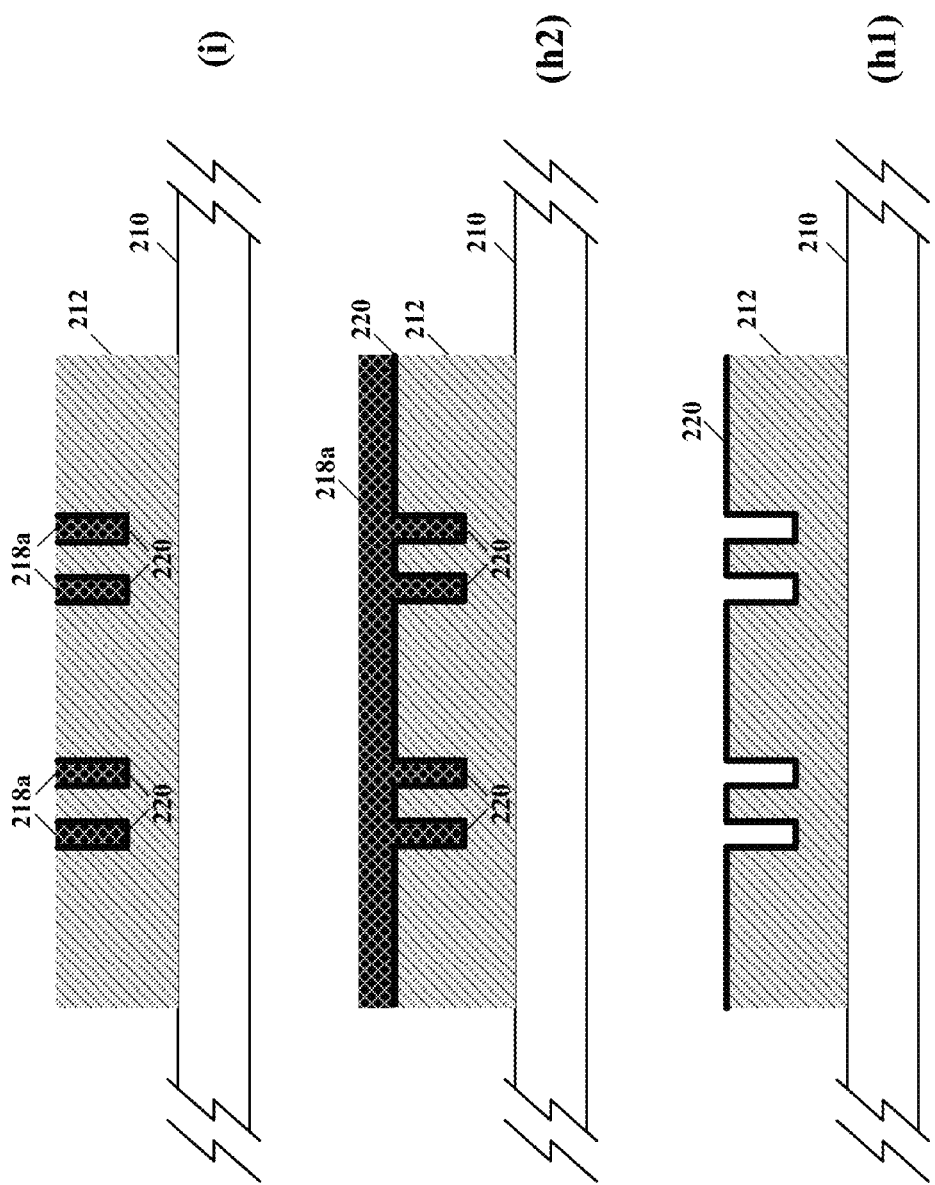
Figure 5:
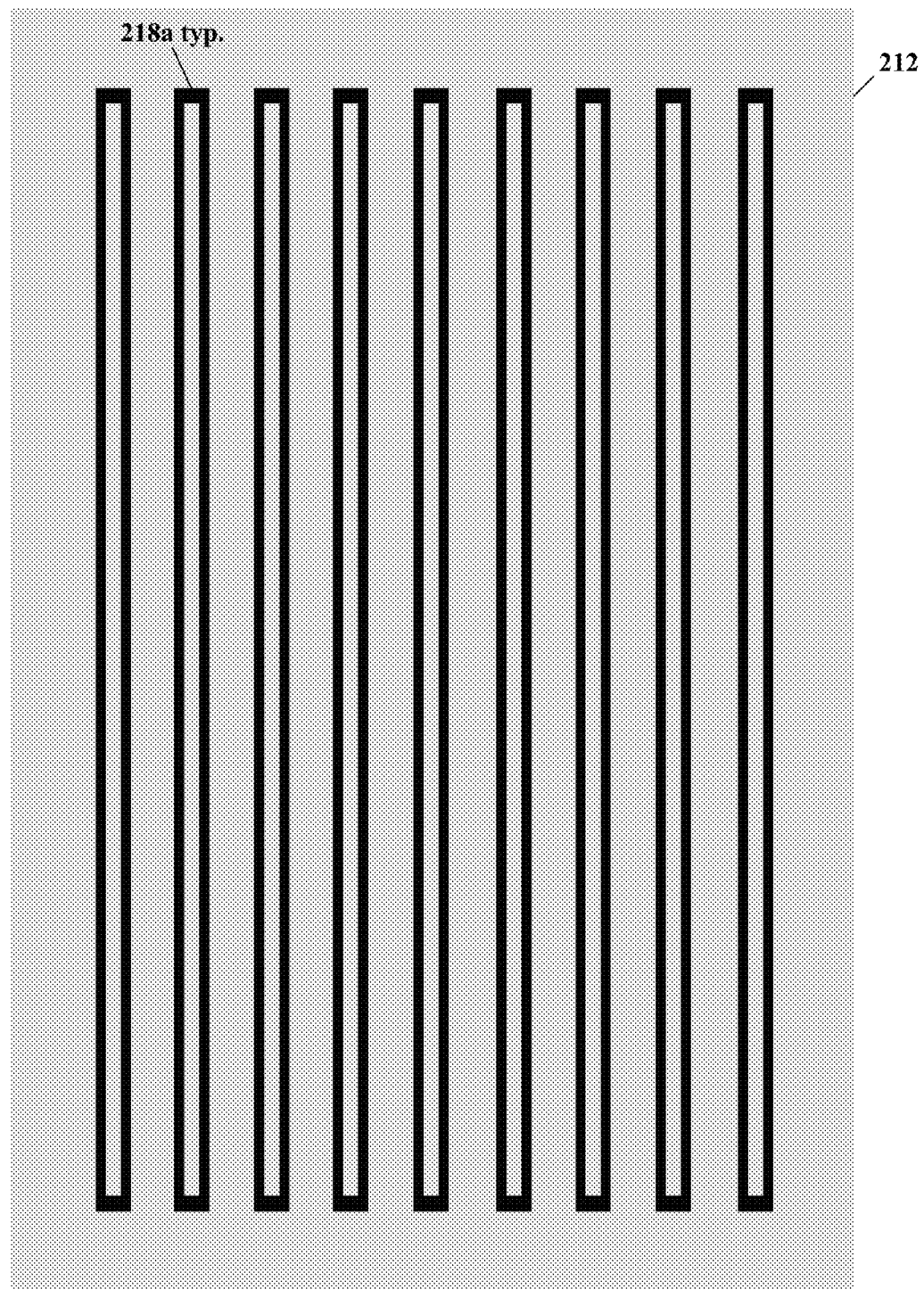
FIG. 5 illustrates a schematic plan view diagram of a plurality of sub-lithographic patterns of conductive lines formed in a semiconductor die, according to a specific example embodiment of this disclosure.

Referring to FIGS. 4 and 5, depicted are schematic plan view diagrams of a plurality of sub-lithographic patterns of conductive lines formed in a semiconductor die, according to specific example embodiments of this disclosure. After removal of the continuous conductive material 218 down to where the tops of the fence conductors 218a are exposed as shown in FIGS. 3A and 3B step (i), the fence conductors 218a are ready for further processing. The fence conductors 218a may be separated in order to form useful independent circuit conductors. The plurality of fence conductors 218a shown in FIG. 5 may represent conductors used for a semiconductor transistor array.

Figure 6:
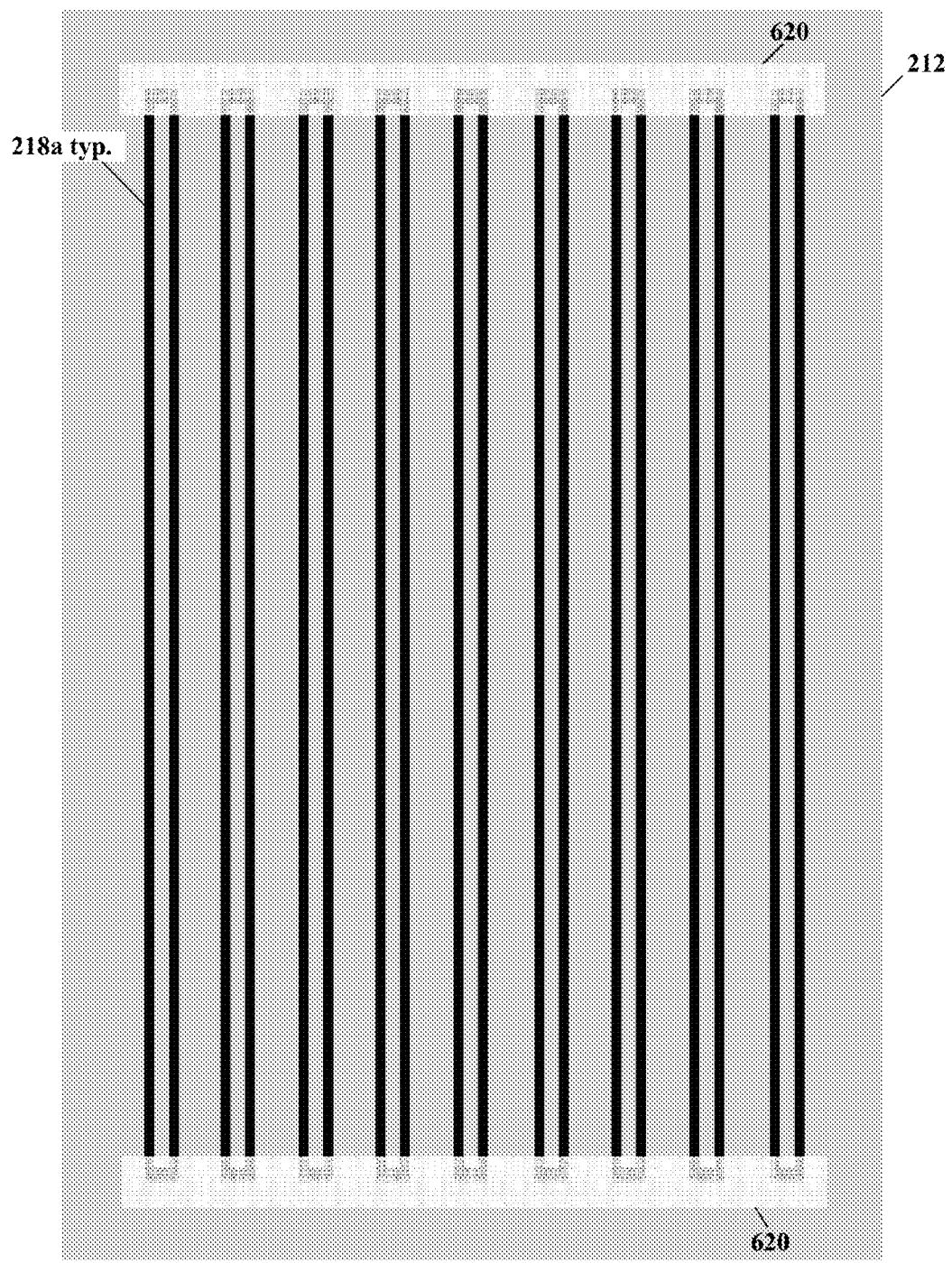
FIG. 6 illustrates a schematic plan view diagram of the plurality of sub-lithographic patterns of conductive lines shown in FIG. 5 being prepared for separating the conductive lines from each other, according to a specific example embodiment of this disclosure.

Referring to FIG. 6, depicted is a schematic plan view diagram of the plurality of sub-lithographic patterns of conductive lines shown in FIG. 5 being prepared for separating the conductive lines from each other, according to a specific example embodiment of this disclosure. The ends of the fence conductors 218a, represented by the numeral 620, are to be broken, e.g., separated apart, disconnections made therebetween, etc. The ends 620 may be routed to a "safe" area on the die 104 and may be "severed" (cut) with a removal process such as, for example but not limited to, aggressive reactive-ion etching (RIE), where the ends 620 are exposed and the remainder of the plurality of fence conductors 218a are protected from the RIE, e.g., masked.

Figure 7:
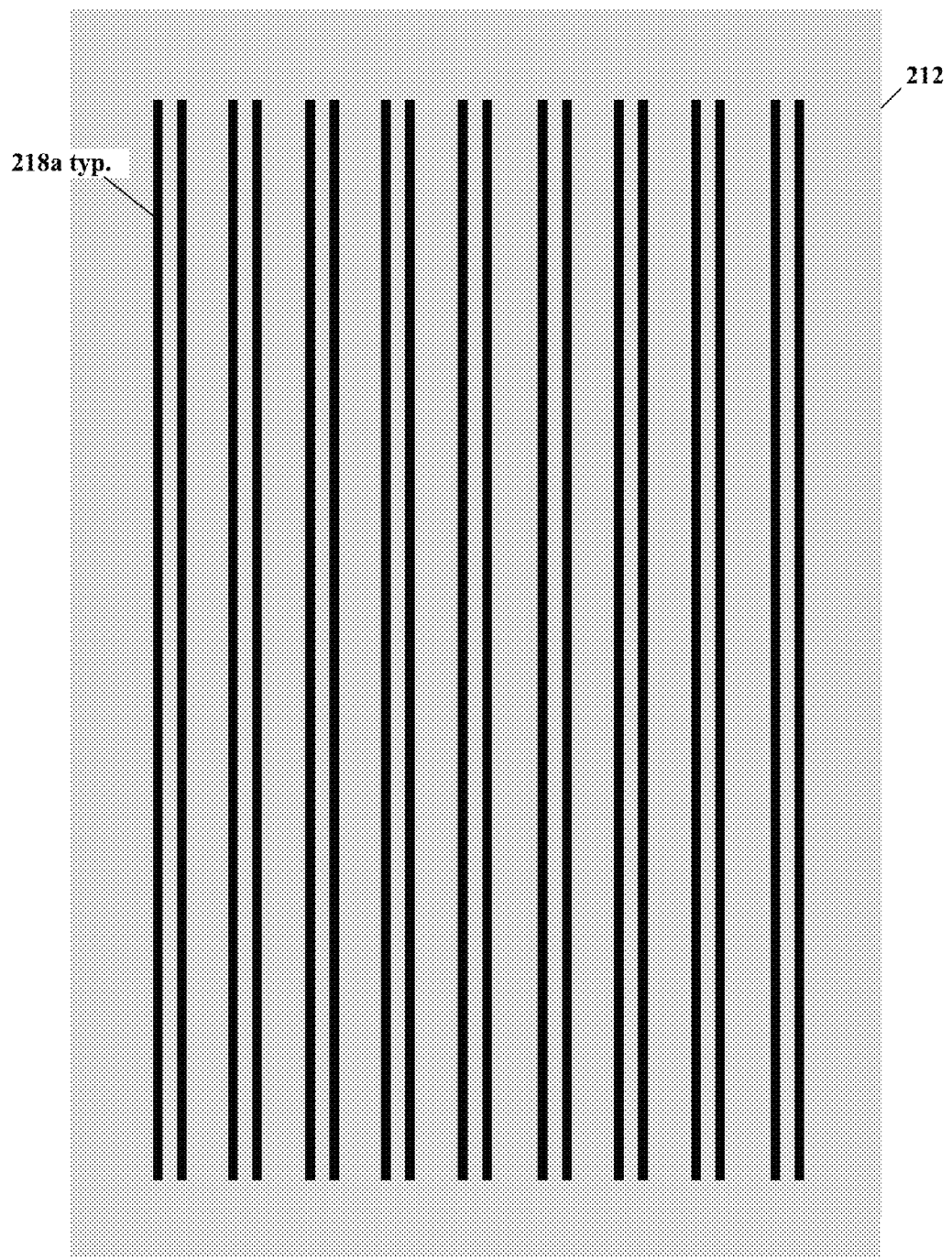
FIG. 7 illustrates a schematic plan view diagram of the plurality of sub-lithographic patterns of conductive lines shown in FIGS. 5 and 6 with portions of the conductive lines removed to separate the conductive lines from each other, according to a specific example embodiment of this disclosure.

Referring to FIG. 7, depicted is a schematic plan view diagram of the plurality of sub-lithographic pattern with portions of the conductive lines removed to separate the conductive lines from each other, according to a specific example embodiment of this disclosure. After the ends 620 have been removed, a third dielectric fill (not shown) may be required to fill the gaps created by the RIE process. Once this third dielectric fill has been completed, a chemical mechanical planarization (CMP) process may be performed on the face of the die 104. The RIE mask may also be performed Via like to selectively break the fence conductors 218a at any place on the die 104.

Figure 8:
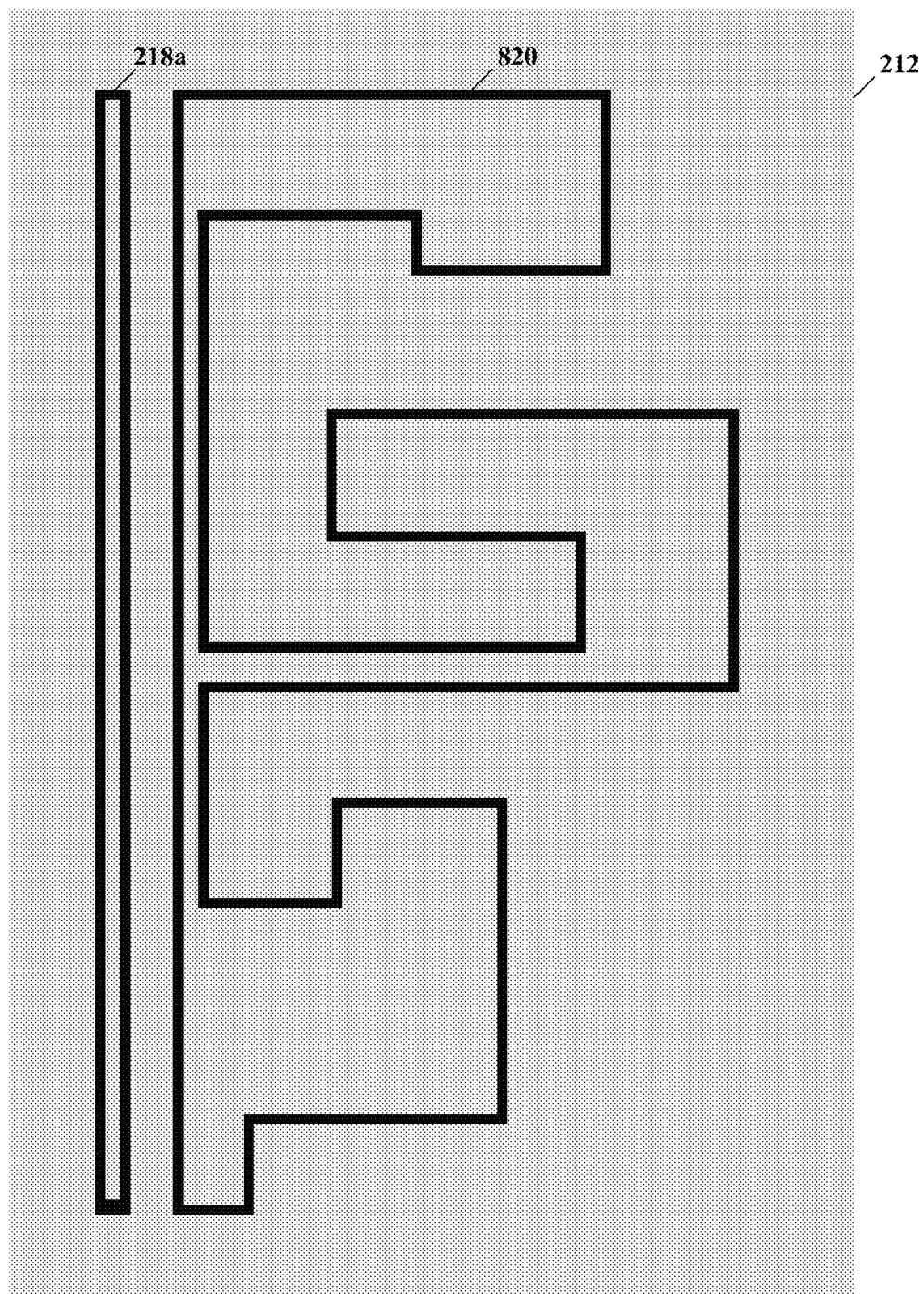
FIG. 8 illustrates a schematic plan view diagram of a plurality of sub-lithographic patterns of conductive lines having various routing paths that are formed in a semiconductor die, according to another specific example embodiment of this disclosure.

Referring to FIG. 8, depicted is a schematic plan view diagram of a plurality of sub-lithographic patterns of conductive lines having various routing paths that are formed in a semiconductor die, according to another specific example embodiment of this disclosure. Fence conductors 218a as shown have been described more fully hereinabove. In is contemplated and with the scope of this disclosure that fence conductors 820 may be routed in as many different paths as desired and configured as conductors between active elements, e.g., transistors, on the semiconductor die 104. The steps for creating a trench of this pattern and creating the fence conductors 820 may be formed through appropriate masks (not shown) and the same or similar processes as the process steps shown in FIGS. 2, 3 and 3A, and the accompanying descriptions thereof as more fully described hereinabove.

Figure 9:
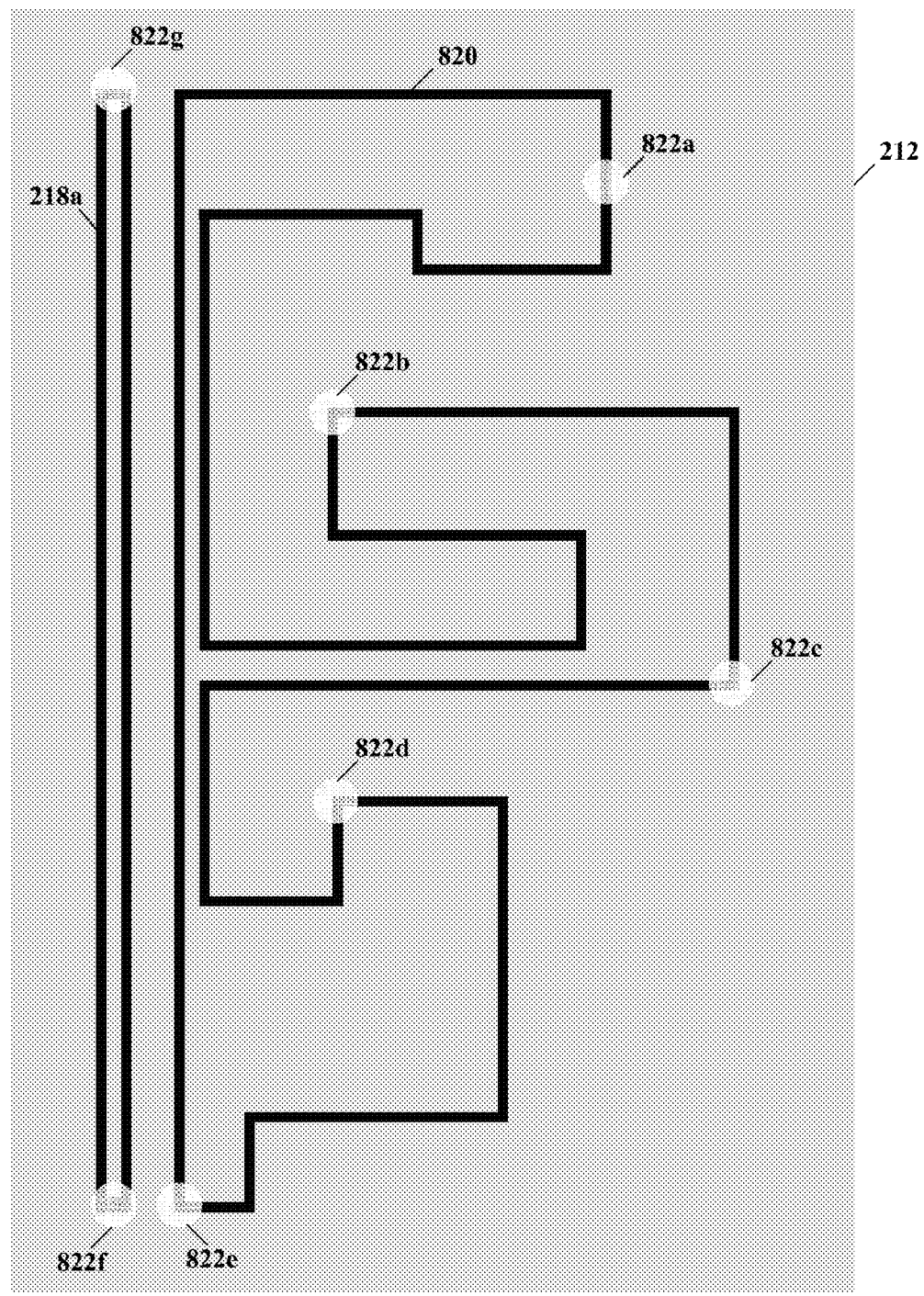
FIG. 9 illustrates a schematic plan view diagram of a plurality of sub-lithographic patterns of conductive lines having various routing paths as shown in FIG. 8 being prepared for separation into independent conductors in a semiconductor die, according to another specific example embodiment of this disclosure.

Referring to FIG. 9, depicted is a schematic plan view diagram of a plurality of sub-lithographic patterns of conductive lines having various routing paths as shown in FIG. 8 being prepared for separation into independent conductors in a semiconductor die, according to another specific example embodiment of this disclosure. The fence conductors 820 may be separated, e.g., disconnections made therebetween, at various locations, generally represented by the numeral 822, on the semiconductor die 104. These separation locations 822 may be accomplished using Via style processes as is well known to those having ordinary skill in the art of semiconductor manufacturing and having the benefit of this disclosure.

Figure 10:
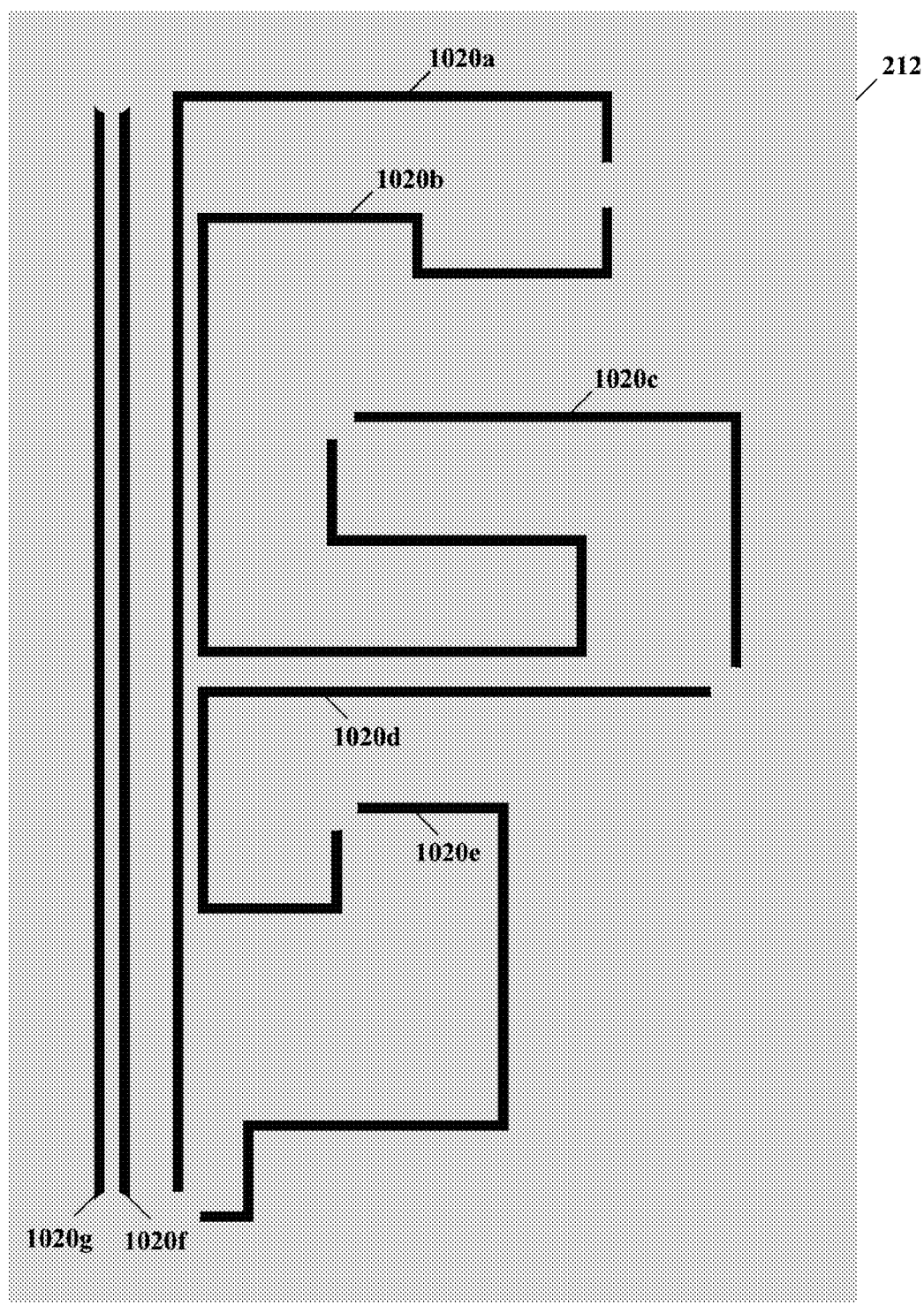
FIG. 10 illustrates a schematic plan view diagram of a plurality of sub-lithographic patterns of conductive lines having various routing paths as shown in FIGS. 8 and 9 after being separated into independent conductors in a semiconductor die, according to another specific example embodiment of this disclosure.

Referring to FIG. 10, depicted is a schematic plan view diagram of a plurality of sub-lithographic patterns of conductive lines having various routing paths as shown in FIGS. 8 and 9 after being separated into independent conductors in a semiconductor die, according to another specific example embodiment of this disclosure. The via style fence separations may be filled in with another dielectric process deposition, then the fully separated fence conductors 1020 may be further connected to the active elements, e.g., transistors, and other connection nodes (not shown) in the semiconductor die 104.

Figure 11:
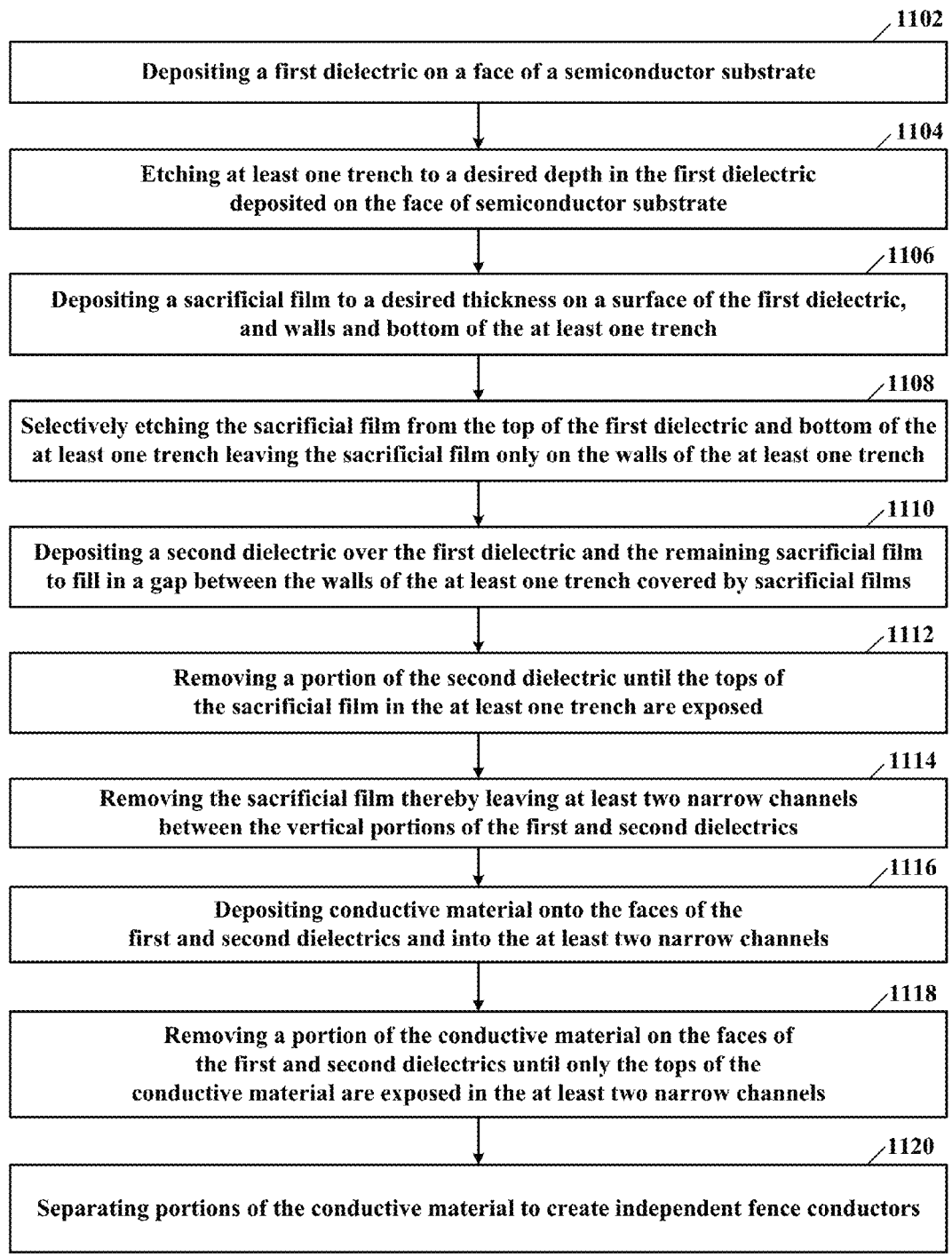
FIG. 11 illustrates a schematic process flow diagram for forming a plurality of sub-lithographic patterns of conductive lines in a semiconductor die, according to specific example embodiments of this disclosure.

Referring to FIG. 11, depicted is a schematic process flow diagram for forming a plurality of sub-lithographic patterns of conductive lines in a semiconductor die, according to specific example embodiments of this disclosure. In step 1102 a first dielectric 212 may be deposited on a face of a semiconductor substrate (die) 210. In step 1104 at least one trench 214 may be etched into the dielectric 212. In step 1106 a sacrificial film 222 may be deposited to a desired thickness on the first dielectric 212, and the walls and bottom of the at least one trench 214. In step 1108 the sacrificial film 222 may be selectively etched from the top of the first dielectric 212, and the bottom of the at least one trench 214.

In step 1110 a second dielectric 212a may be deposited over the first dielectric 212 and the remaining sacrificial film 222 on the walls of the at least one trench 214 so as to fill in the gap therebetween. In step 1112 a portion of the second dielectric 212a may be removed, e.g., polished off, until the tops of the sacrificial films 222 are exposed. In step 1114 the sacrificial films 222 may be removed thereby leaving at least two narrow channels between vertical portions of the first and second dielectrics 212 and 212a. In step 1116 a conductive material 218 may be deposited onto the faces of the first and second dielectrics and into the at least two narrow channels. In step 1118 a portion of the conductive material 218 on the faces of the first and second dielectrics 212 and 212a may be removed until only the tops of the remaining conductive material 218a are exposed in the at least two narrow channels. In step 1120 portions of the conductive material 218a may be separated, e.g., disconnections made therebetween, so as to create independent fence conductors 1020 that may be used to interconnect active devices (not shown) in the semiconductor die 104.

Figure 12:
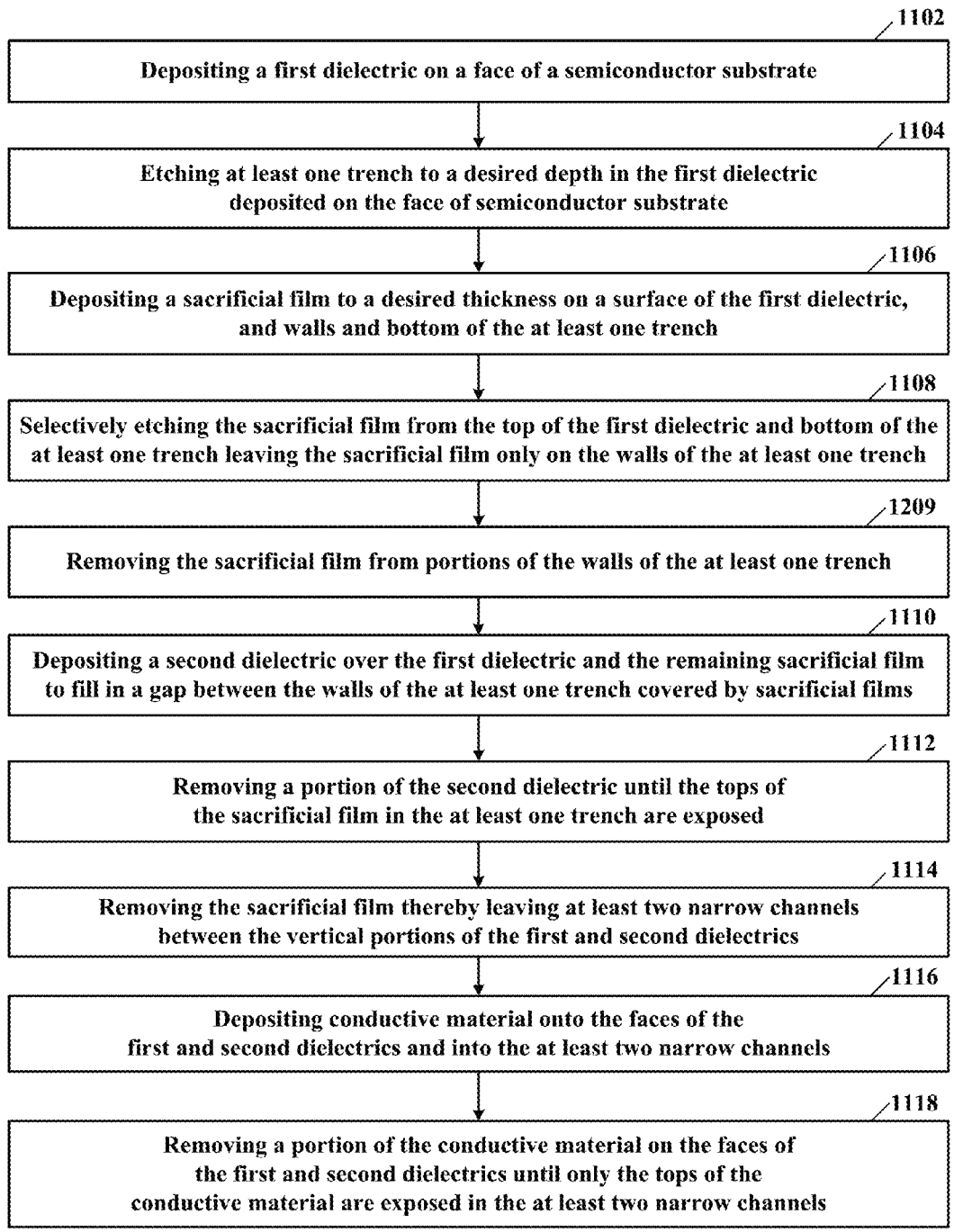
FIG. 12 illustrates a schematic process flow diagram for forming a plurality of sub-lithographic patterns of conductive lines in a semiconductor die, according to other specific example embodiments of this disclosure.

Referring to FIG. 12, depicted is a schematic process flow diagram for forming a plurality of sub-lithographic patterns of conductive lines in a semiconductor die, according to other specific example embodiments of this disclosure. In step 1102 a first dielectric 212 may be deposited on a face of a semiconductor substrate (die) 210. In step 1104 at least one trench 214 may be etched into the dielectric 212. In step 1106 a sacrificial film 222 may be deposited to a desired thickness on the first dielectric 212, and the walls and bottom of the at least one trench 214. In step 1108 the sacrificial film 222 may be selectively etched from the top of the first dielectric 212, and the bottom of the at least one trench 214. In step 1209 the sacrificial film may be removed from portions of the walls of the at least one trench. Step 1209 may effectively eliminate step 1120 in FIG. 11 for creating independent fence conductors 1020 that may be used to interconnect active devices (not shown) in the semiconductor die 104.

In step 1110 a second dielectric 212a may be deposited over the first dielectric 212 and the remaining sacrificial film 222 on the walls of the at least one trench 214 so as to fill in the gap therebetween. In step 1112 a portion of the second dielectric 212a may be removed, e.g., polished off, until the tops of the sacrificial films 222 are exposed. In step 1114 the sacrificial films 222 may be removed thereby leaving at least two narrow channels between vertical portions of the first and second dielectrics 212 and 212a. In step 1116 a conductive material 218 may be deposited onto the faces of the first and second dielectrics and into the at least two narrow channels. In step 1118 a portion of the conductive material 218 on the faces of the first and second dielectrics 212 and 212a may be removed until only the tops of the remaining conductive material 218a are exposed in the at least two narrow channels.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. A method for forming fence conductors in a semiconductor integrated circuit die, said method comprising the steps of:
   depositing a first dielectric on a face of a semiconductor substrate;
   creating at least one trench in the first dielectric;
   depositing a sacrificial film on the first dielectric including walls and a bottom of the at least one trench;
   removing portions of the sacrificial film from a face of the first dielectric and the bottom of the at least one trench, wherein only sacrificial films remain on the walls of the at least one trench;
   depositing a second dielectric between the sacrificial films on the walls of the at least one trench;
   removing the first and second dielectrics until top portions of the sacrificial film are exposed between the first and second dielectrics;
   removing the sacrificial films between the first and second dielectrics leaving at least two narrow channels therein;
   depositing conductive material on faces of the first and second dielectrics and into the at least two narrow channels;
   removing portions of the conductive material on the faces of the first and second dielectrics until only tops of the conductive material are exposed in the at least two narrow channels: and
   depositing a barrier layer in one of the at least two narrow channels before the step of depositing the conductive material therein.

2. The method according to claim 1, after the step of removing portions of the conductive material on the faces of the first and second dielectrics, further comprising the step of separating portions of the conductive material in the at least two narrow channels into independent fence conductors.

3. The method according to claim 1, after the step of removing portions of the sacrificial film from the face of the first dielectric and the bottom of the at least one trench, further comprising the step of removing the sacrificial film from portions of the walls of the at least one trench.

4. The method according to claim 1, wherein the step of depositing the first dielectric comprises the step of depositing the first dielectric to a thickness of from about 1 nanometer to about 2000 nanometers on the face of the semiconductor substrate.

5. The method according to claim 1, wherein the step of depositing the first dielectric comprises the step of depositing the first dielectric to a thickness of from about 1 nanometer to about 100 nanometers on the face of the semiconductor substrate.

6. The method according to claim 1, wherein the step of creating the at least one trench comprises the step of creating the at the least one trench to a depth of from about 1 nanometer to about 2000 nanometers in the first dielectric.

7. The method according to claim 1, wherein the step of creating the at least one trench comprises the step of creating the at the least one trench to a depth of from about 1 nanometer to about 100 nanometers in the first dielectric.

8. The method according to claim 1, wherein the step of creating the at least one trench comprises the step of creating the at the least one trench having a width of from about 1 nanometer to about 2000 nanometers in the first dielectric.

9. The method according to claim 1, wherein the step of creating the at least one trench comprises the step of creating the at the least one trench having a width of from about 1 nanometer to about 100 nanometers in the first dielectric.

10. The method according to claim 1, wherein the step of depositing the sacrificial film comprises the step of depositing the sacrificial film to a thickness of from about 1 nanometer to about 2000 nanometers.

11. The method according to claim 1, wherein the step of depositing the sacrificial film comprises the step of depositing the sacrificial film to a thickness of from about 1 nanometer to about 100 nanometers.

12. The method according to claim 1, wherein the step of depositing the second dielectric comprises the step of depositing the second dielectric to a thickness of from about 1 nanometer to about 2000 nanometers.

13. The method according to claim 1, wherein the step of depositing the second dielectric comprises the step of depositing the second dielectric to a thickness of from about 1 nanometer to about 100 nanometers.

14. The method according to claim 1, comprising depositing at least one of the first dielectric, the second dielectric, or the sacrificial film using an atomic layer deposition (ALD) process.

15. The method according to claim 1, wherein the sacrificial film is selected from the group consisting of SiN, $SiO_2$ and $SiO_xN_y$.

16. The method according to claim 1, wherein the conductive material is selected from the group consisting of Al, Ag, Au, Fe, Ta, TaN, Ti and TiN.

17. The method according to claim 2, wherein the step of separating portions of the conductive material comprises the step of separating portions of the conductive material with reactive-ion etching (RIE).

18. A method for forming fence conductors in a semiconductor integrated circuit die, said method comprising the steps of:
   depositing a first dielectric on a face of a semiconductor substrate;
   creating at least one trench in the first dielectric;
   depositing a sacrificial film on the first dielectric including walls and a bottom of the at least one trench;

removing portions of the sacrificial film from a face of the first dielectric and the bottom of the at least one trench, wherein only sacrificial films remain on the walls of the at least one trench;

depositing a second dielectric between the sacrificial films on the walls of the at least one trench;

removing the first and second dielectrics until top portions of the sacrificial film are exposed between the first and second dielectrics;

removing the sacrificial films between the first and second dielectrics leaving at least two narrow channels therein;

depositing conductive material on faces of the first and second dielectrics and into the at least two narrow channels;

removing portions of the conductive material on the faces of the first and second dielectrics until only tops of the conductive material are exposed in the at least two narrow channels;

separating portions of the conductive material with reactive-ion etching (RIE); and filling gaps created by the RIE with dielectric and chemical mechanical planarization (CMP) polishing thereof.

* * * * *